United States Patent [19]

Duncan

[11] Patent Number: 4,772,873

[45] Date of Patent: Sep. 20, 1988

[54] DIGITAL ELECTRONIC RECORDER/PLAYER

[75] Inventor: Virgil D. Duncan, Raleigh, N.C.

[73] Assignee: Digital Recorders, Inc., Research Triangle Park, N.C.

[21] Appl. No.: 772,132

[22] Filed: Aug. 30, 1985

[51] Int. Cl.$^4$ ............................................. H03M 1/00
[52] U.S. Cl. .................................... 341/110; 377/108; 381/31; 364/724.01
[58] Field of Search .... 340/347 SH, 347 M, 347 AD, 340/347 DA; 364/572, 576, 178, 179, 724; 358/138; 381/31

[56] References Cited

U.S. PATENT DOCUMENTS

| | | | |
|---|---|---|---|
| 3,882,404 | 5/1975 | Bell | 377/108 X |
| 4,058,826 | 11/1977 | Schneider | 324/88 X |
| 4,121,051 | 10/1978 | Place | 381/51 |
| 4,156,286 | 5/1979 | Connors et al. | 365/45 |
| 4,318,188 | 3/1982 | Hoffman | 365/45 |
| 4,363,050 | 12/1982 | Modla | 360/32 |
| 4,384,170 | 5/1983 | Mozer et al. | 381/51 |
| 4,417,283 | 11/1983 | Hoshimi et al. | 358/310 |
| 4,491,958 | 1/1985 | Umemura et al. | 381/51 |
| 4,568,912 | 2/1986 | Kitamura et al. | 340/347 AD X |
| 4,673,916 | 6/1987 | Kitamura et al. | 340/347 AD X |

OTHER PUBLICATIONS

RCA Manufacture's Data Sheet entitled "CMOS Presettable Divide-By-'N' Counter, pp. 113-117.
National Semiconductors MF4 and MF6 Data Sheet Jul. 1983.

Primary Examiner—T. J. Sloyan
Attorney, Agent, or Firm—Richard E. Jenkins

[57] ABSTRACT

The invention is a digital record/playback apparatus including an input digital filter, and A/D converter, a solid state memory, a D/A converter and an output digital filter. The entire system is driven off a single clock source which allows the frequent response of the filters to be modified simultaneous with the sampling frequency of the A/D and D/A converter. This allows the record/playback apparatus to record low frequency signals, such as medical data, as well as relatively high frequency signals such as voice, by simply changing the frequency of the clock source. In addition, the apparatus includes an expandable memory which allows recording of up to one hour or more of program material.

6 Claims, 10 Drawing Sheets

DIGITAL ELECTRONIC RECORDER/PLAYER

DESCRIPTION

1 Technical Field

This invention relates to a digital recording and playback system for recording and reproducing various types of analog information.

2 Background Art

In order to record and reproduce various types of analog information, for example, sound, video, medical data, stock market conditions, music, weather and the like, it is customary to use disk, wire, magnetic tape and other electro-mechanical record playback devices However, these types of record playback devices experience mechanical problems since motors and other moving parts are used in the process of loading and unloading the program material. Additionally, memory medium whether it be disk, wire, magnetic tape, etc., all degrade the quality of the program material contained therein after constant repetition.

Recently, all solid state digital record and playback systems have been developed. Digital record and playback systems eliminate those problems associated with conventional electro-mechanical record and playback devices by utilizing solid state digital memory instead of motors, magnetic tapes or disks. Constant repetition of the recorded program material, which is required when used in, for example, a teaching machine or vending machine will not degrade the quality of the program as has been the case in conventional recorders. Additionally, since solid state digital recorders have no moving parts, the recorder is virtually maintenance free.

DISCLOSURE OF THE INVENTION

It is an object of the present invention to provide a solid state electronic recording and playback device which eliminates those electro-mechanical problems associated with conventional recorders.

It is another object of the present invention to provide a digital recorder which does not degrade the quality of the analog information after continuous use.

It is a further object of the present invention to provide a digital record and playback device with higher quality voice reproduction capability than is presently known.

Digital record and play utilizes a series of 1's and 0's for digital memory storage. The input analog signal is converted to a digital signal by an analog to digital (A/D) converter. The digital signal is then stored in memory. In playback, the stored digital information is fetched from memory and converted back to the original input analog system through a digital to analog (D/A) converter. Of the many different types of A/D and D/A converters available today, the present invention uses a continuous-variable-slope-delta (CVSD) modulator. CVSD encoders do not store digital representations of the input analog signal but instead encode changes of the input analog signal over time. By recording the direction of change of the input analog signal rather than the amount, each sample can be encoded as a single bit. Consequently, a CVSD converter is able to provide a continuous one bit serial data stream output. The process of performing the analog to digital conversion is accomplished by sampling the input analog signal at uniform intervals. The sampling rate is defined by the Nyquist theorem. Simply stated, the Nyquist theorem dictates that for a given signal to be sampled without loss of information, the signal must be sampled at a rate of at least twice the highest frequency contained in the signal. If energy from the input signal having frequencies more than one-half of the Nyquist frequency is mixed in with the energy being measured, a phenomenon known as aliasing occurs. Aliasing involves the folding of the high-frequency signals down into the low-frequency band. To prevent aliasing, the input signal must be band limited. Therefore, band limiting filters must be used to condition the input signals.

The system of the present invention uses an eight-bit serial to parallel converter to store eight bits of the digital signal at a time. For example, a 256K memory chip can store 262,144 bits of digital data; however, by using an eight-bit converter the same digital data may be stored in a memory chip of 32K by 8. Other memory media such as bubble memory, RAMs, DRAMs, PROMs, EPROMs, etc., may be used. The embodiment of the present invention utilizes a 64K CMOS static RAM. This memory is interchangeable with the 64K CMOS EPROM. The RAM provides instantaneous record and play while the EPROM provides a fixed play program.

Filters must also be used in the output on playback to eliminate the sample frequency and to recover the original signal. In the past, these filters were fixed passive devices or fixed active devices. When the bandwidth of the signal or the sampling frequency was changed, it was necessary to change the entire filter. To avoid this problem, digital filters were designed. The present invention uses digital filters which are placed in front of the conversion circuitry to high-frequency limit the input analog audio signal. Digital filters are also placed after the conversion circuit to remove the sample frequency and recover the original analog audio signal.

BEST MODE FOR CARRYING OUT THE INVENTION

Figure 1:
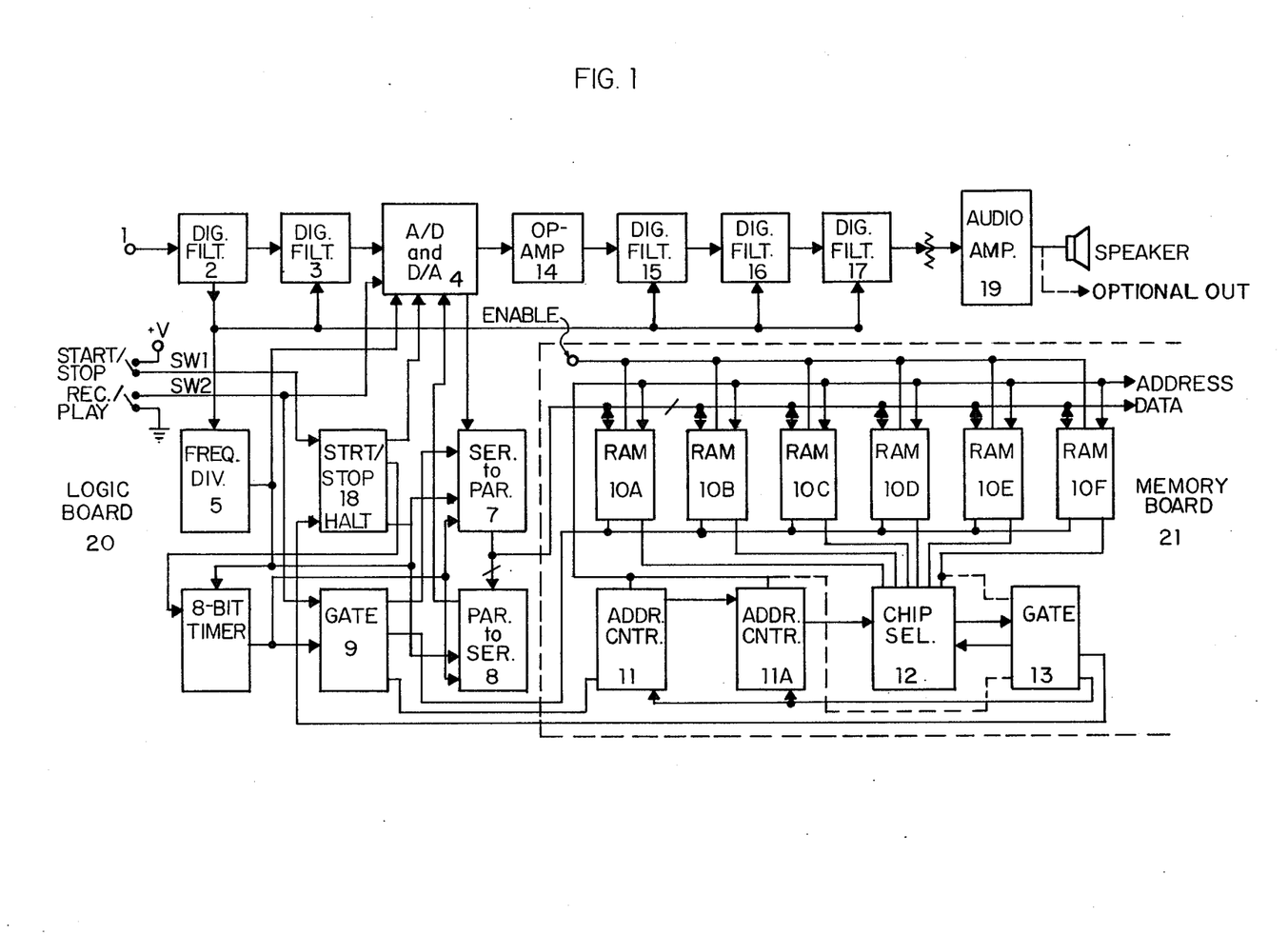
FIG. 1 is an exemplary block diagram of the present invention.

FIG. 1 is a block circuit diagram showing a complete embodiment of the invention. In FIG. 1, an analog audio signal is supplied from an analog input terminal 1 to a first of two digital filters 2 and 3 connected in series. The two digital filters 2 and 3 limit the high frequencies of the analog audio input signal. The high frequency limited analog signal is then supplied from digital filter 3 to an analog to digital converter (A/D) 4. A digital to analog (D/A) converter is also on the same chip 4 as the A/D converter.

Clocking for the entire digital recorder system is on board the first digital filter 2. This clocking frequency typically is 144 Kilohertz and is supplied directly to the other digital filters 3, 15, 16 and 17 and to the frequency divider 5. To avoid aliasing and harmonic heterodyning, the clocking for the A/D and D/A converter must be synchronized with the rest of the system. This is accomplished by feeding the clock frequency signal from filter 2 to the rest of the digital filters in the system and dividing the clocking frequency signal before it is fed to the A/D and D/A converter 4 and to the logic board 20. Accordingly, the clock signal is fed from digital filter 2 to the frequency divider 5. The frequency divider then supplies the frequency divided clocking signal to the A/D converter 4, the eight-bit timer 6, the serial to parallel converter 7 and the parallel to serial converter 8.

Figure 2:
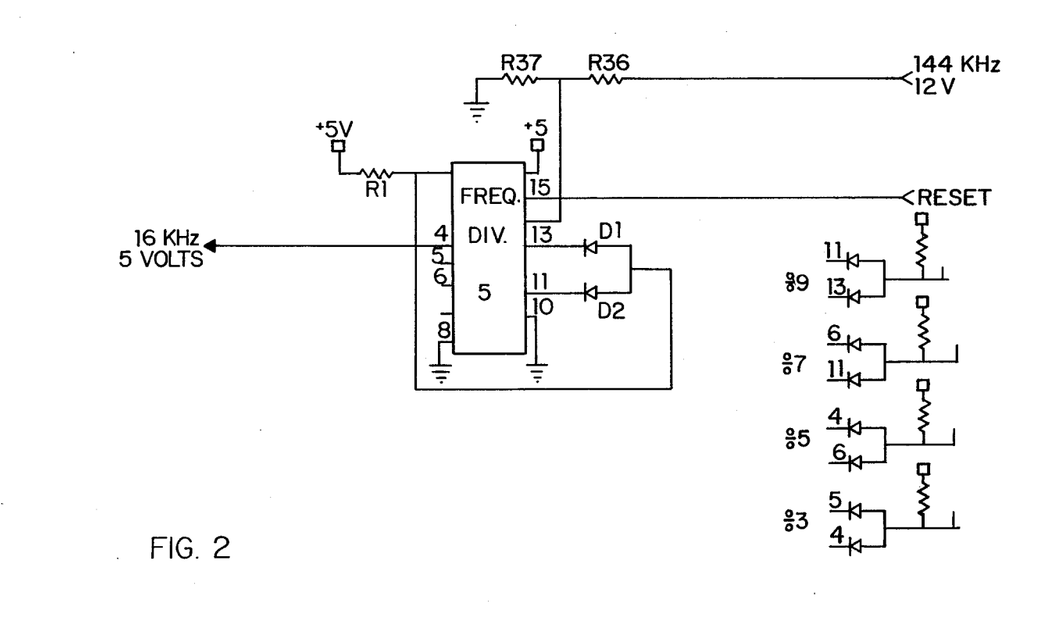
FIG. 2 is a schematic representation of an odd-division circuit of the present invention.

The frequency divided clocking signal supplied from the frequency divider 5 to the A/D converter 4 defines the sampling frequency. The sampling frequency is the rate at which the analog audio signal from digital filter 3 is converted to a digital signal. For example, if the clocking frequency is 144 Kilohertz and the frequency divider 5 is jumpered for a divide by nine function, then the sample frequency will be 16 KHz. In other words, the analog signal will be converted to a digital signal at a rate of 16,000 bits/sec. Frequency divider 5 may be jumpered for divide by eight, divide by nine or divide by ten functions to maintain synchronization. The frequency divider 5 will perform the divide by eight and divide by ten function internally. FIG. 2 shows a divide by nine circuit which may be used in the invention.

Referring to FIG. 2, this circuit performs odd frequency division using two diodes D1 and D2 and one resistor R1 with an even frequency divider (for example, CD 4018 BE). As shown in FIG. 2, the divide by 9, divide by 7, divide by 5 and divide by 3 function can be performed by the same circuit. The corresponding pin connections for these divisions are shown on the lower right hand side of FIG. 2. For a divide by nine function, the cathodes of the two diodes D1 and D2 are connected to pins 13 and 11, respectively. Resistor R1 which is connected between pin 1 and a five volt source, and the anodes of diodes D1 and D2 are also connected to pin 1. This circuit permits the even frequency divider to skip all individual 1's in the feedback to accomplish the odd division. Typically with 144 Kilohertz input provided on pin 14 from the digital filter, the odd frequency divider can convert the 144 Kilohertz input clock to 16 Kilohertz output as shown at pin 4 of the divider 5.

Pins 8 and 10 of frequency divider 5 are grounded. Pin 16 is connected to a five volt supply and pin 15 resets the divider.

Referring again to FIG. 1, digital output from A/D converter 4 is serial and is fed to the serial to parallel converter 7. Converter 7 converts the serial output from A/D converter 4 to eight bits parallel. An eight-bit timer 6 operating at about two Kilohertz provides the eight bit strobe to gate 9 for memory storage and memory read.

The memory board, which is indicated by the dotted lines in FIG. 1, contains 6 memory chips 10A-10F, two address chips 11 and 11A, a select chip 12 and a gate 13. In the embodiment of FIG. 1, CMOS static RAMs are used; however, CMOS static EPROMS or ROMs may also be used or intermixed. The address chips 11 and 11A use the clock from gate 9 to provide address lines for the memory chips. Address counter 11A delivers an address to select chip 12 which selects one of the six RAMS. Accordingly, an enable line is connected to each RAM and chip select 12 has six output lines, one output line to each RAM. The output line from gate 13 is connected to the Halt input of start/stop chip 18. Accordingly, a designated address and RAM location can stop the system during the record or play mode.

During playback, the memory outputs eight digital data bits at a time from the six memory chips 10A-10F via the data bus into a parallel to serial converter 8 at typical rate of 2 Kilohertz. Converter 8 then shifts the data bits out as a serial digital data stream to D/A converter 4 which converts the serial digital data stream into the originally recorded analog audio signal.

During playback, the program output from D/A 4 is fed to an impedance converter which is Op-Amp 14. The output of the Op-Amp 14 is connected to digital filters 15, 16, and 17. These digital filters remove the sampling frequency and recover the original program.

Chip 18 accepts inputs from start switch SW1 and Gate 13. Chip 18 provides an output to timer 6 to start and stop operation. SW2 determines the record or play operation by changing the mode of converter 4.

An output audio amplifier 19 is connected to the last digital filter 17 and provides an output into 8 ohms with 5 watts maximum power. This output may be converted to 600 ohms output either unbalanced or balanced. The digital recorder operates from a nominal supply voltage connected to switch SW1 of 12 volts DC at 75 milliamps, or about 1 watt plus audio output power.

Figure 3:
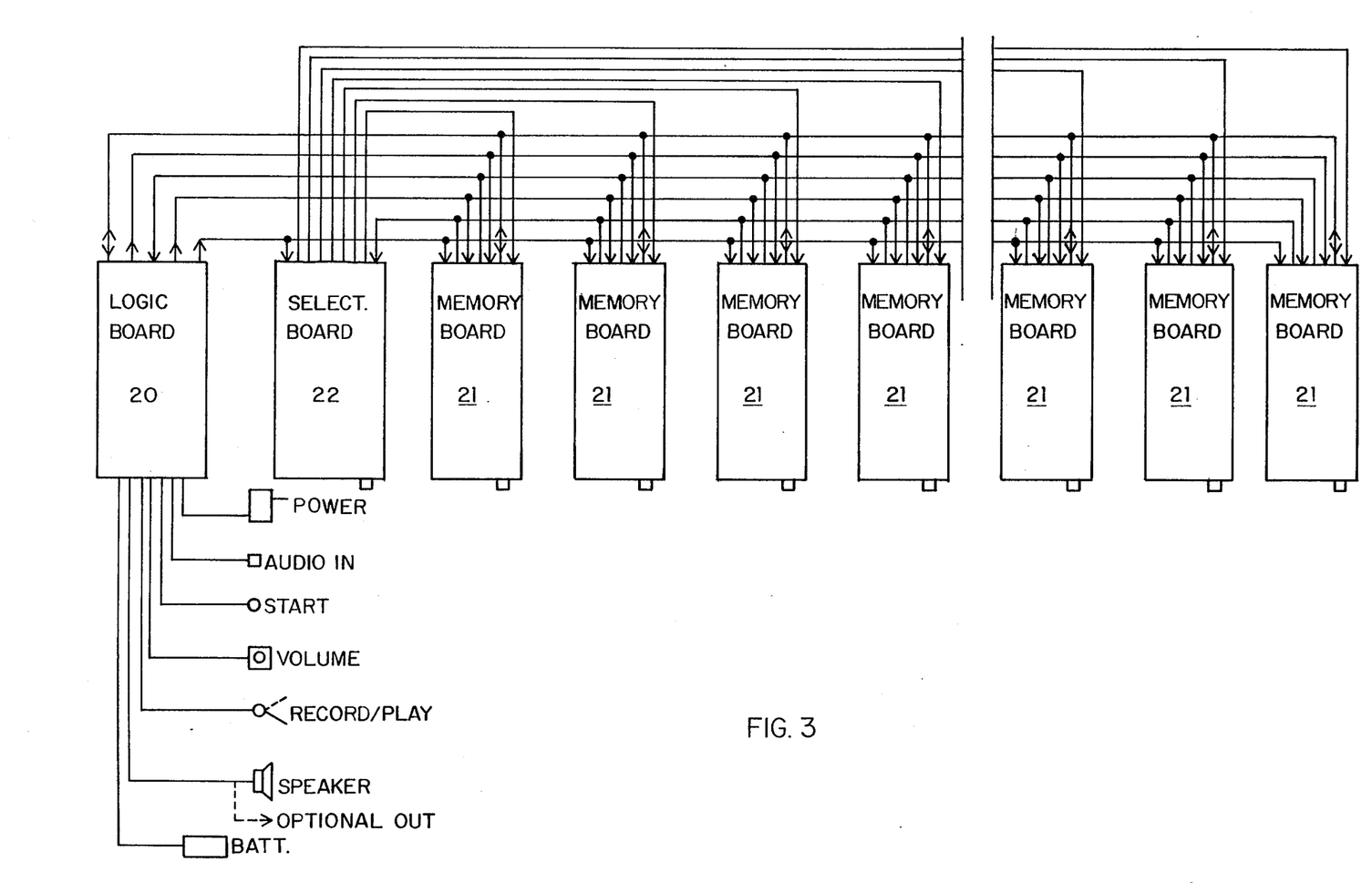
FIG. 3 is a block diagram of the recorder showing memory expansion.

FIG. 3 illustrates the modular construction of the solid state digital recorder which allows memory expansion. By using one selector board 22, fifteen memory boards 21 can be added to a single unit.

Each memory board 21 provides a maximum of twenty-four seconds of audio record/play time depending upon the conversion frequency. Using fifteen memory boards 21 for one unit allows record/play time of from 4 seconds to 6 minutes in 4 second increments. Low frequency medical or analog signals add considerable record/playback. Switches on the memory board determine the length of the program and the number of memory chips required.

Static RAMs are used for the record/play mode. With this type of memory, loss of power typically means loss of memory. The recorder uses battery backup provided on the logic board as shown in FIG. 3 to counteract possible loss of power. Typically, this is two type AAA alkaline batteries. The batteries will support a typical CMOS static RAM memory system in excess of 600 days without external power. It is recommended that the batteries be replaced every two years. One logic board 20, one selector board 22 and fifteen memory boards 21 make up a full system.

The full system may be further expanded to a number of full systems working from one logic board 20. Selection of full systems may be manual, by external control or by automatic means. Typically with 10 full systems, since each system has 6 minutes of memory, the record/playback time would be one hour for audio. This is not the limit on full system expansion.

Figure 4A:
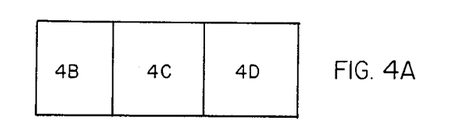
FIGS. 4a–d is a schematic drawing of the logic board of the present invention.

Referring now to FIGS. 4A-D, a detailed description of the solid state digital recorder player logic board circuit 20 will now be provided. FIG. 4A shows the ordering of FIGS. 4B, 4C, and 4D. Twelve volts of DC power from lead 7 of connector J1 is used by the digital filters 2 and 3, Op-amp 14, digital filters 15, 16, 17 and audio amplifier 19 which is connected to audio output line 9 of J1. All of the logic circuits in the converter 4 use 5 volts. The 5 volts is reduced from the 12 volts input by regulator VR1. For CMOS circuits, a voltage regulator type 78L05 is preferably used. The 78L05 is a TO-92 plastic package and has a current limit of 100 milliamps. The operating current for the package is about 2.5 milliamps. If standard EPROM or ROM memories are used, a type 7805 regulator with heat sink is used as VR1 for increasing current requirements.

Figure 4B:
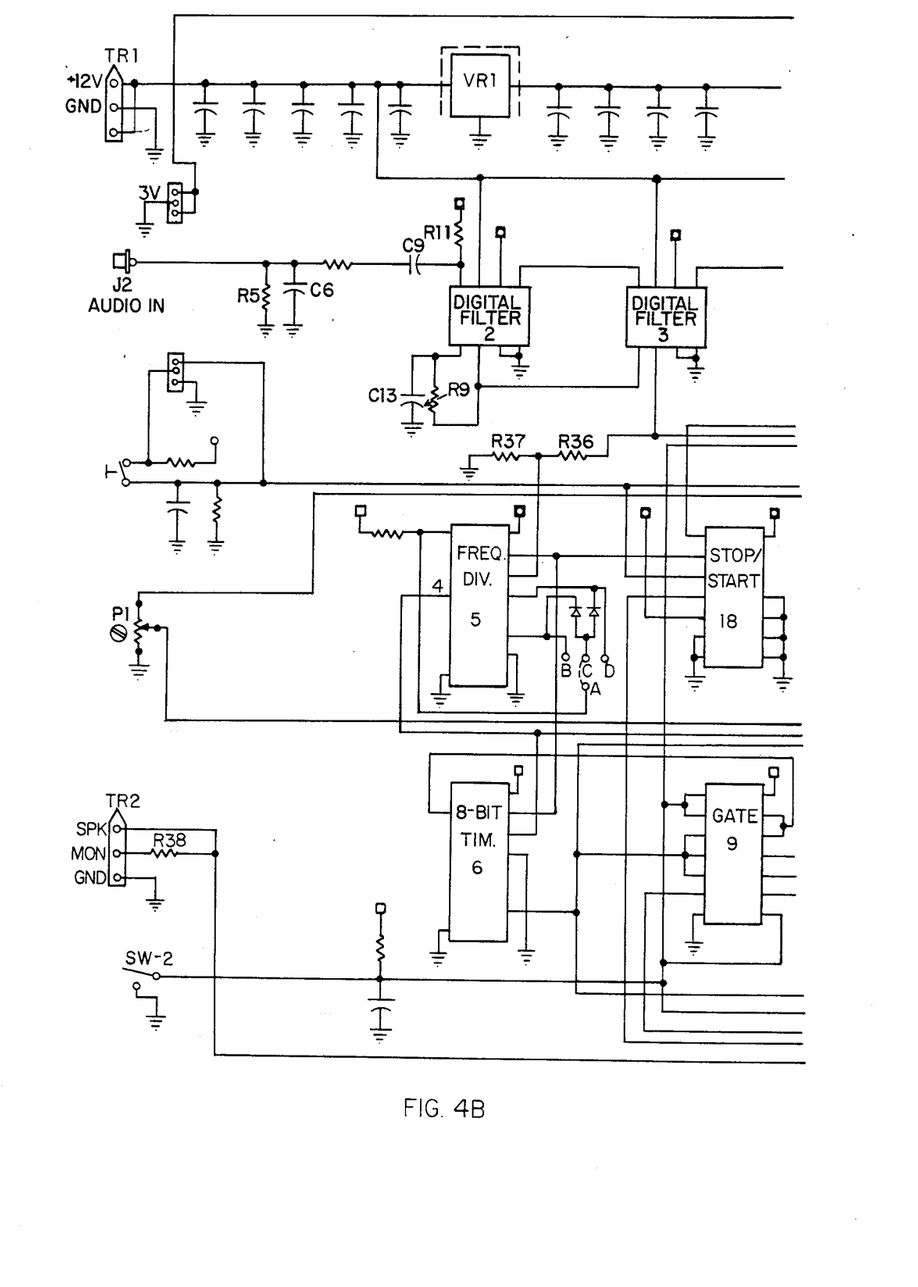
Figure 4C:
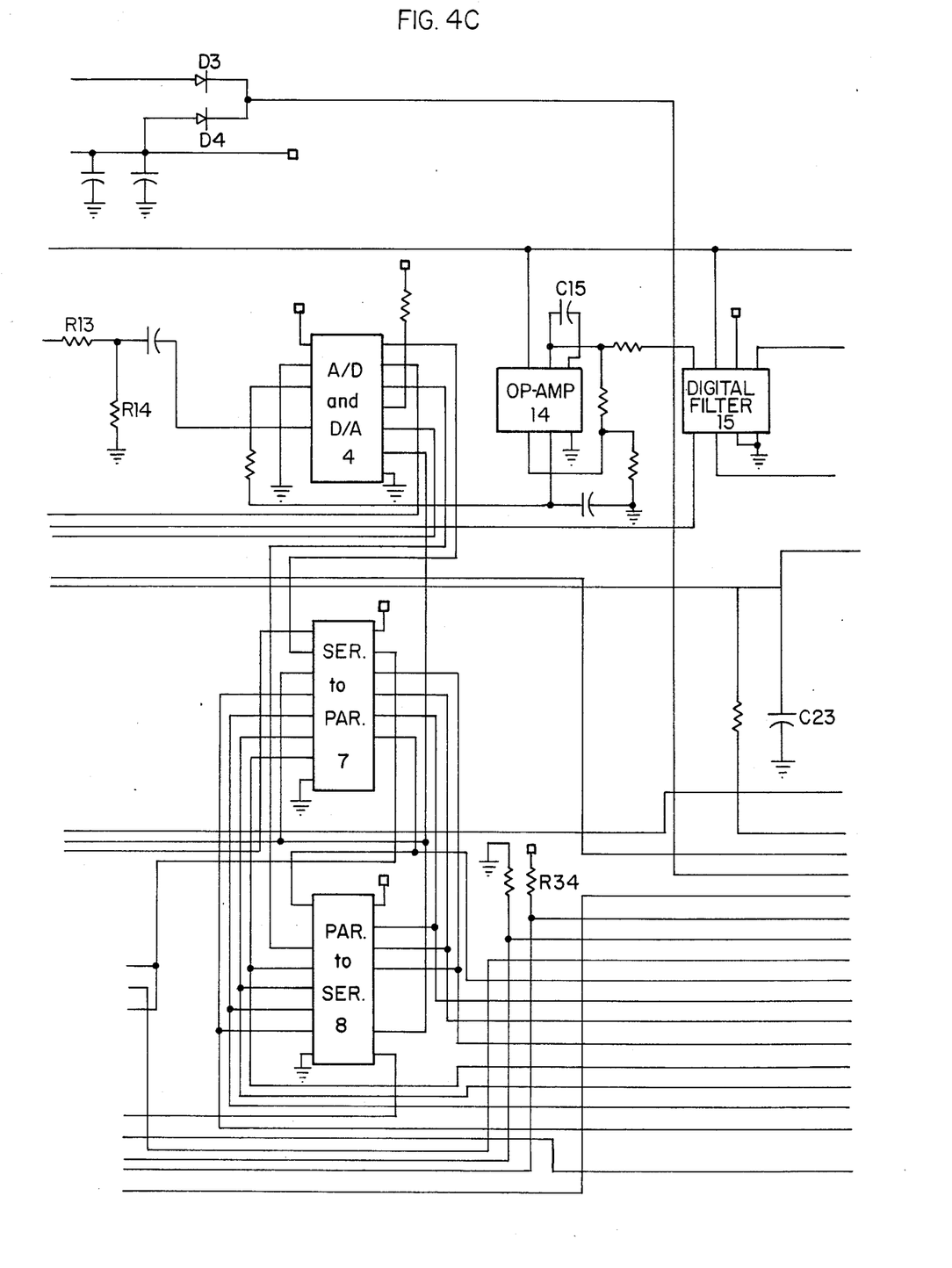
Figure 4D:
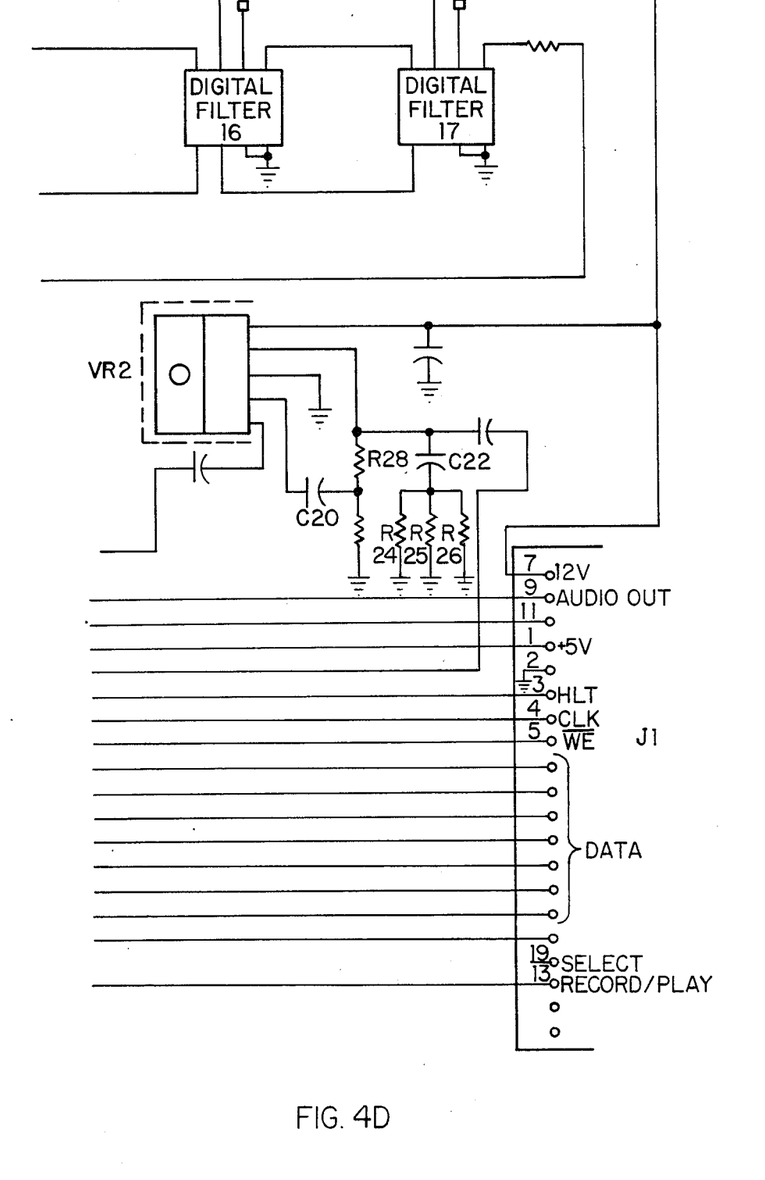

The memory boards also use 5 volts from VR1 which is on lead No. 1 of connector J1. Diodes D3 and D4 are reverse blocking Schottky diodes for CMOS static RAM memory support and are connected to connector H2. The three volts from the backup batteries is supplied to connector H2.

Terminal TR1 is the connection for the 12 volt DC input. The 12 volt DC source is normally a 12 volt DC wall plug power supply. However, any well filtered DC power source from ten to fifteen volts with over one-hundred milliamps capacity may be used.

Connector J2 is the program input which is 600 ohms unbalanced. Resistor R5 is connected to J2 and is the terminating resistor for the normal input level of −5 dbm. Capacitor C6 is connected in parallel to R5 and is used to suppress any input radio-frequency-interference RFI and to prevent RFI radiating from the digital filter. The low frequency response is determined by C9 and R11. The values shown in FIG. 4B provide a 3dB loss at 50 Hertz. Capacitor C9 and resistor R11 may be changed to adjust the low frequency response, for example, for use in medical applications.

Filters 2 and 3 and 15-17 are typically MFHCN type digital filters. These digital filters determine high frequency response. The ratio of the −3dB high frequency response to the digital clocking frequency is around 50 to 1. For a digital clocking frequency of 144 Kilohertz, the −3dB high frequency response is approximately 2.88 Kilohertz. The high frequency response can be changed by changing the digital clocking frequency. Capacitor C13 and resistor R9 connected to filter 2 determine the digital clocking frequency. This clocking frequency is used to synchronize all the digital filters 2, 3, 15, 16 and 17 and the logic clocking. All the digital filters operate at unity gain.

Resistors R13 and R14 provide an additional 3dB loss for an input level of −8dB to converter 4. Converter 4 can be a CVSD type No. 34-724. When pin 10 of converter 4 is high, converter 4 is in play mode, and when pin 10 of converter 4 is low, it is in record mode. With fixed memories such as a ROM or EPROM, a play mode only chip can be used for converter 4.

For synchronization, the 12 volt digital filter clock is taken from digital filter 3, pin 2, output. Resistors R36 and R37 connected to pin 2 of filter 3 reduce the 12 volt clock to 5 volts. The 5 volt clock is connected to pin 14 of frequency divider 5. Frequency divider 5 may be jumpered for divide by 8 (A to B), divide by 9 (A to C) and divide by 10 (A to D). For divide by 9, the circuit of FIG. 2 may be used to avoid adding an additional integrated circuit.

Output of the frequency divider is taken from pin 4. This output is the CVSD and logic clocking frequency. For a digital clocking frequency of 144 Kilohertz, the divide by 9 circuit of FIG. 2 gives the CVSD a frequency of 16 Kilohertz. However, the CVSD can use any frequency from 9 Kilohertz to 64 Kilohertz. Also the digital filter clocking rate can be any frequency from 5 Hertz to 1 Megahertz.

Converter 4 is a continuous-variable-slope-delta modulator (CVSD). For analog to digital conversion, the output is a serial digital data stream and for digital to analog conversion, the input is a serial digital data stream. In record mode, serial to parallel converter 7 converts the serial digital data stream to eight data bits (one byte) for the memory chips (each 8K by 8). In play mode, parallel to serial converter 8 converts the eight data bits to a serial digital data stream. For a 16 Kilohertz CVSD rate, eight-bit timer 6 divides by eight at a rate of 2 Kilohertz for strobing memory write or read.

Start/stop chip 18 provides start/stop operation. A stop or halt command comes from the memory boards on pin No. 3 of chip 18. A high on pin No. 3 of chip 18 designates a halt command. If there are no memory boards available in the system, resistor R34 which is connected to the halt input at connector J1, holds the halt line high to prevent operation. Gate 9 is three, triple input NAND gates.

The divide by eight strobe 6 is connected to converter 7 and converter 8 for parallel/serial strobing and to pins 3, 4 and 5 of gate 9 for inversion. The inverted strobe output on pin 6 of gate 9 is the clock to the memory boards on lead No. 4 of J1. The pins 1, 2 and 8 of gate 9 invert the record line from SW-2. In record, this enables converter 7 which is disabled on play. The output on pin 10 of gate 9 is the write (WE) pulse to memory on lead No. 5 of J1. Eight digital data bits are transmitted to and from memory on leads 6, 8, 10, 12, 14, 16, 18 and 20 of connector J1.

During the play mode, after digital to analog conversion in converter 4, the signal goes to Op-amp 14. The output of converter 4 is a low level signal at a very high impedance. Op-amp 14 provides gain and high to low impedance shift to drive digital filter 15. Capacitor C15 is used with Op-amp 14 to prevent oscillations at low gain. Output digital filters 15, 16 and 17 are used to eliminate the sample frequency. Capacitor C23 aids in suppressing the digital clock frequency out of filter 16. Audio output is available on the output connector bus lead No. 9 of J1.

Potentiometer P1 is the volume control for the output amplifier VR2. Program input is on pin No. 1. Pin No. 4 of amplifier VR2 is program output at a very low impedance capable of directly driving an audio speaker. Capacitor C22 is connected to pin 4 of VR2 and is the output coupling capacitor. Resistors R28 and capacitor C20 form a feedback network to stabilize gain and improve the frequency response of VR2. Resistors R24, R25, R26 and C22 are used to suppress transient response oscillations. Amplifier VR2 is capable of 5 watts output. For 600 ohm balance or unbalance an external transformer can be substituted for the speaker. For earphone or other external program monitoring, and isolating resistor R38 connected to TR2 is used. Monitoring output is on pin No. 2 of TR2.

Figure 5A:
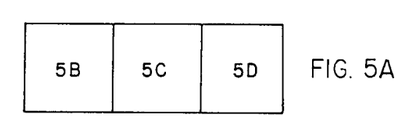
FIGS. 5a–d is a schematic drawing of the memory board of the present invention.
Figure 5B:
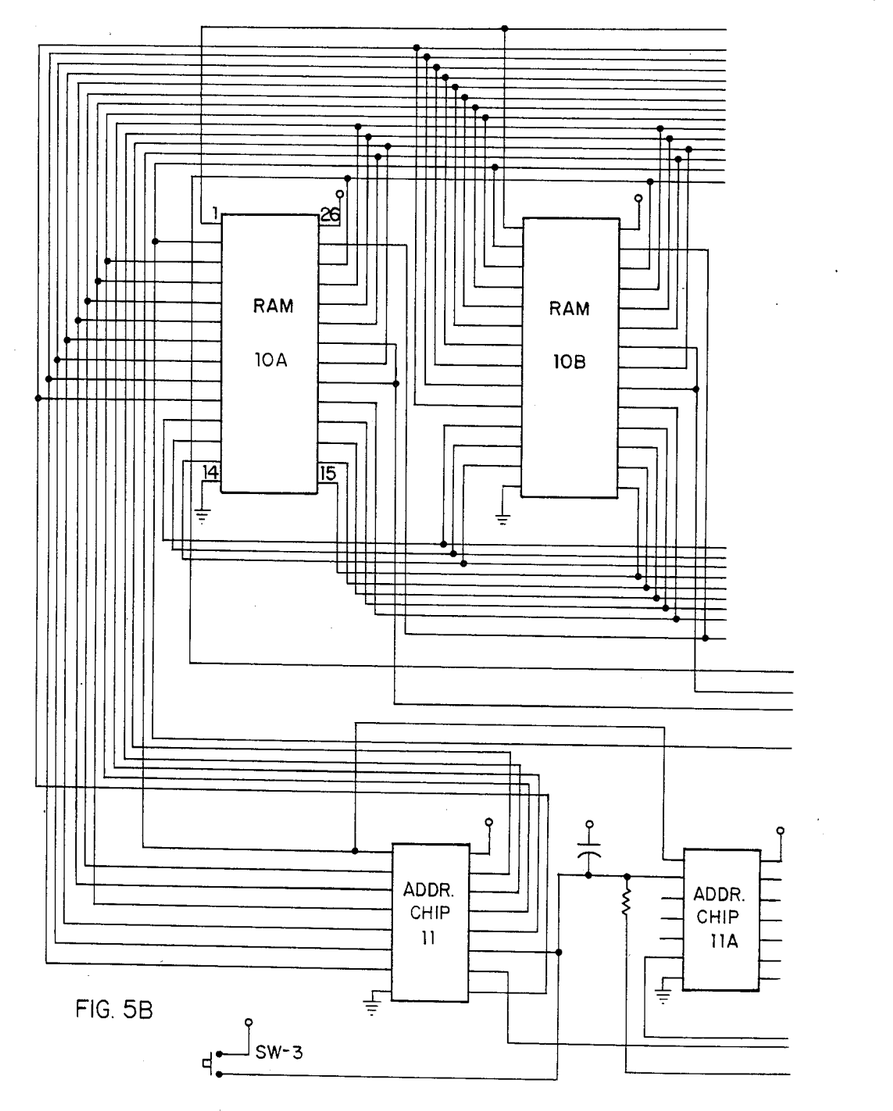
Figure 5C:
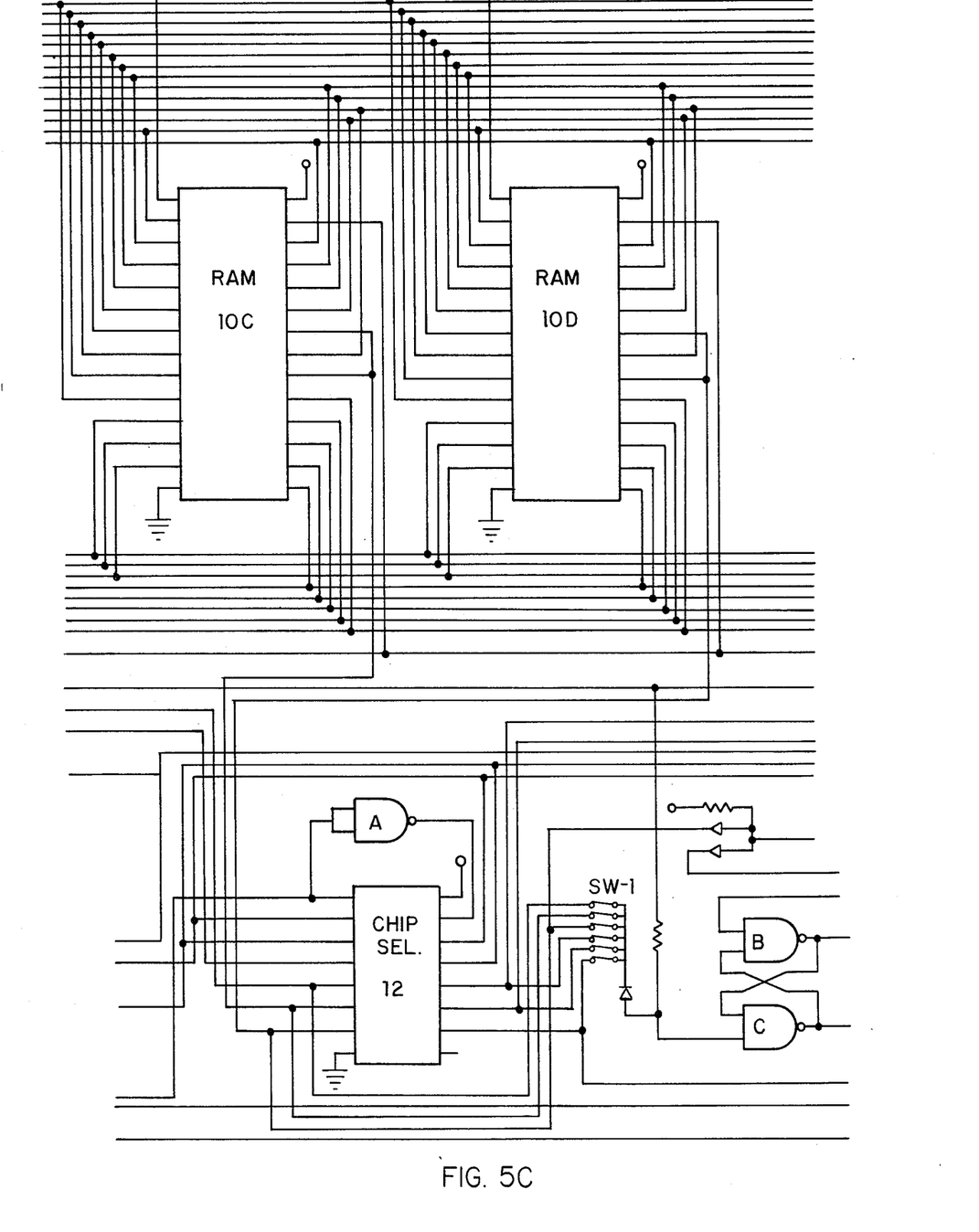
Figure 5D:
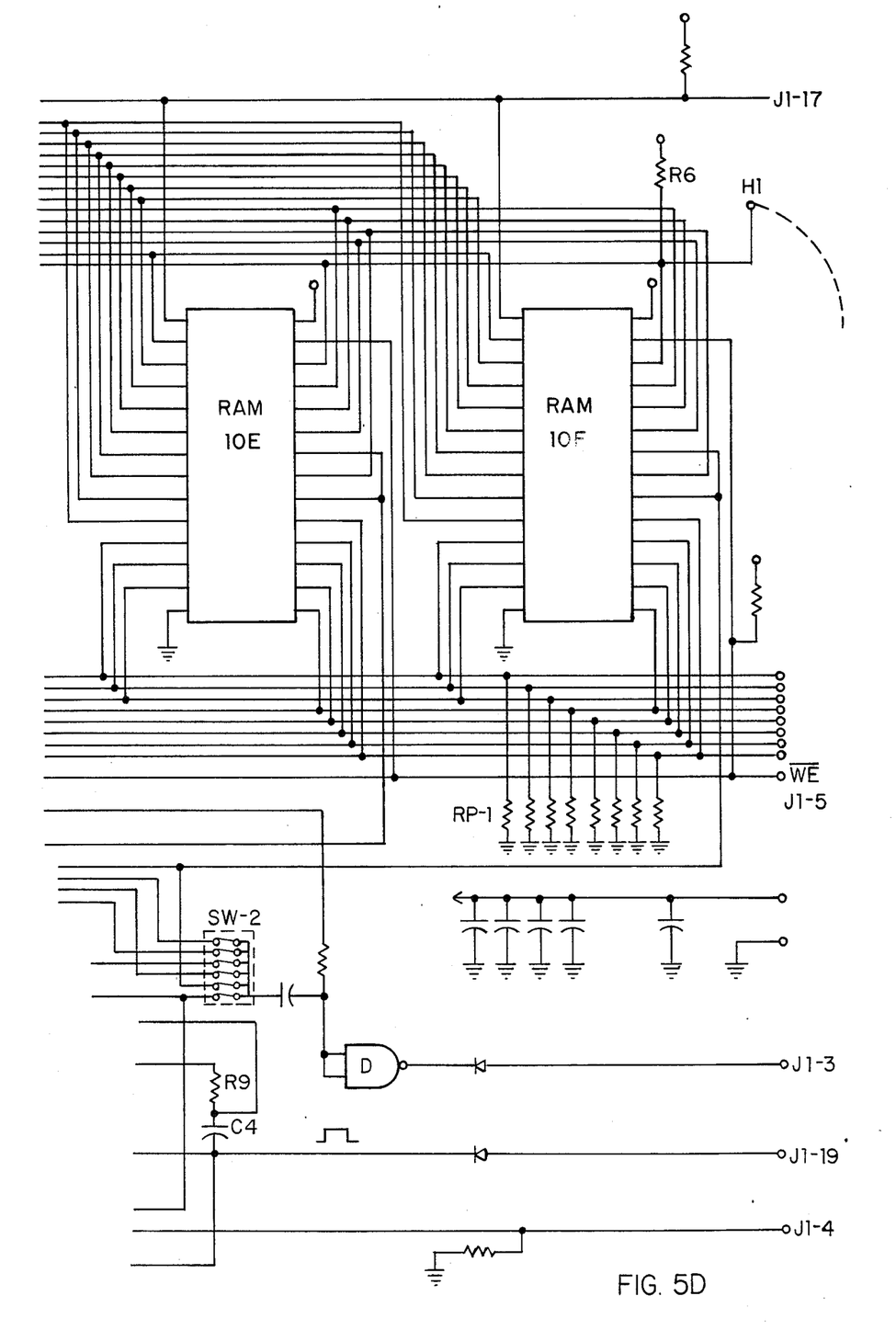

Referring to FIGS. 5A-D, a description of the solid state digital recorder player memory board circuit will now be described. FIG. 5A shows the arrangement of FIGS. 5B-D. There are 6 memory chips (10A-F) on the memory board. These memory chips are shown in FIGS. 5B-D as CMOS static RAM's; however CMOS EPROMS's or CMOS ROM's may be used. ROM's and EPROM's are desirable to prevent local alteration of the stored program or where the program may never be changed. With a battery backup for over 600 days, the RAM's serve the same purpose as an EPROM, but provides for local program change or alteration. Typical RAM's are type SRM-2064C15 and typical EPROM's are type 27C64. All of the memory boards are configured as 8K by 8 bits (65,536 total bits) and are 28 pin compatible. RAM's, ROM's and EPROM's may be intermixed on the same board or in the same system. Up to fifteen memory boards may be used in one system.

Data input and output for each of the six RAMs are on pins 11, 12, 13, 14, 15, 16, 17, 18, and 19. The address lines for each of the RAMS are on pins 10, 9, 8, 7, 6, 5, 4, 3, 25, 24, 23, and 21. Pins 20 and 22 of the RAMS are individual chip enables. Chip select 12 is used to sequence select individual chips. Pins 26 of the RAMS are bussed together to provide board select at terminal H1. When only one memory board is used with one logic board, resistor R6 holds the board in select.

Pins 1 are bussed together and brought out on lead No. J1-17. Pin No. 27 of the RAMS is write ($\overline{WE}$) for the entire board. This signal is on lead No. J1-5. Resistors RP-1 are connected to each data line to hold the data lines low when changing boards. Memory clock is on lead No. J1-4. Address chips 11 and 11A use the clock from pin 10 to provide address lines for the memory. SW-3 is a reset button to set program start at RAM #1. SW-1 is a 6 position dip switch. This switch is used to select the memory chips to be used on the memory board.

The sequence of the memory chips are as follows:

| Switch Position | Chips |
| --- | --- |
| 1 | RAM #1 |
| 2 | #1 and #2 |
| 3 | #1, #2 and #3 |
| 4 | #1, #2, #3 and #4 |
| 5 | #1, #2, #3, #4 and #5 |
| 6 | #1, #2, #3, #4, #5 and #6 |

The memory chips will always record and play in this sequence. The output of SW-1 is a high to low transition to trigger a short duration one-shot comprised of NAND gates B and C. The high output source on pin 4 of C resets address counters 11 and 11A and outputs a select pulse on lead No. J-19. This pulse is about 10 microseconds wide. Resistor R9 and capacitor C4 determine the pulse width. This can be adjusted to meet any record/play time requirements. Gate A is configured as an inverter. Inverter A is used to select the first four memory chips using address A13 and A14 of chip 11A. Address A15 of chip 11A is inverted to select gate B which enables memory chips RAM #5 and RAM #6. SW-2 is a 6 position dip switch and is used to select a time length of messages or programs.

Switch SW-2 operates as follows:

| Switch Position | Time/Message |
| --- | --- |
| 1 | 4 seconds (1, 2, 3, 4, 5, or 6 messages) |
| 2 | 8 seconds (1, 2 or 3 messages) |
| 3 | 12 seconds (1 or 2 messages) |
| 4 | 16 seconds (1 message) |
| 5 | 20 seconds (1 message) |
| 6 | 24 seconds (1 message) |

A combination of SW-1 and SW-2 is required to provide message length and time. These times are nominal and are determined by the clock rate. Only one switch position may be closed at a time. For continuous operation switch SW-2 is left open and message length is determined by SW-1.

Gate D is configured as an inverter. High to low transitions on the output of SW-2 through capacitor C7 will cause a low to high transition on the halt bus, lead No. J1-3. This stops the record or play mode.

When it is desirable to use two or more memory boards in a system, a selector board 22 shown in FIG. 3 is required. Up to fifteen memory boards may be used with one selector board. Several selector boards may be used with one logic board.

Figure 6:
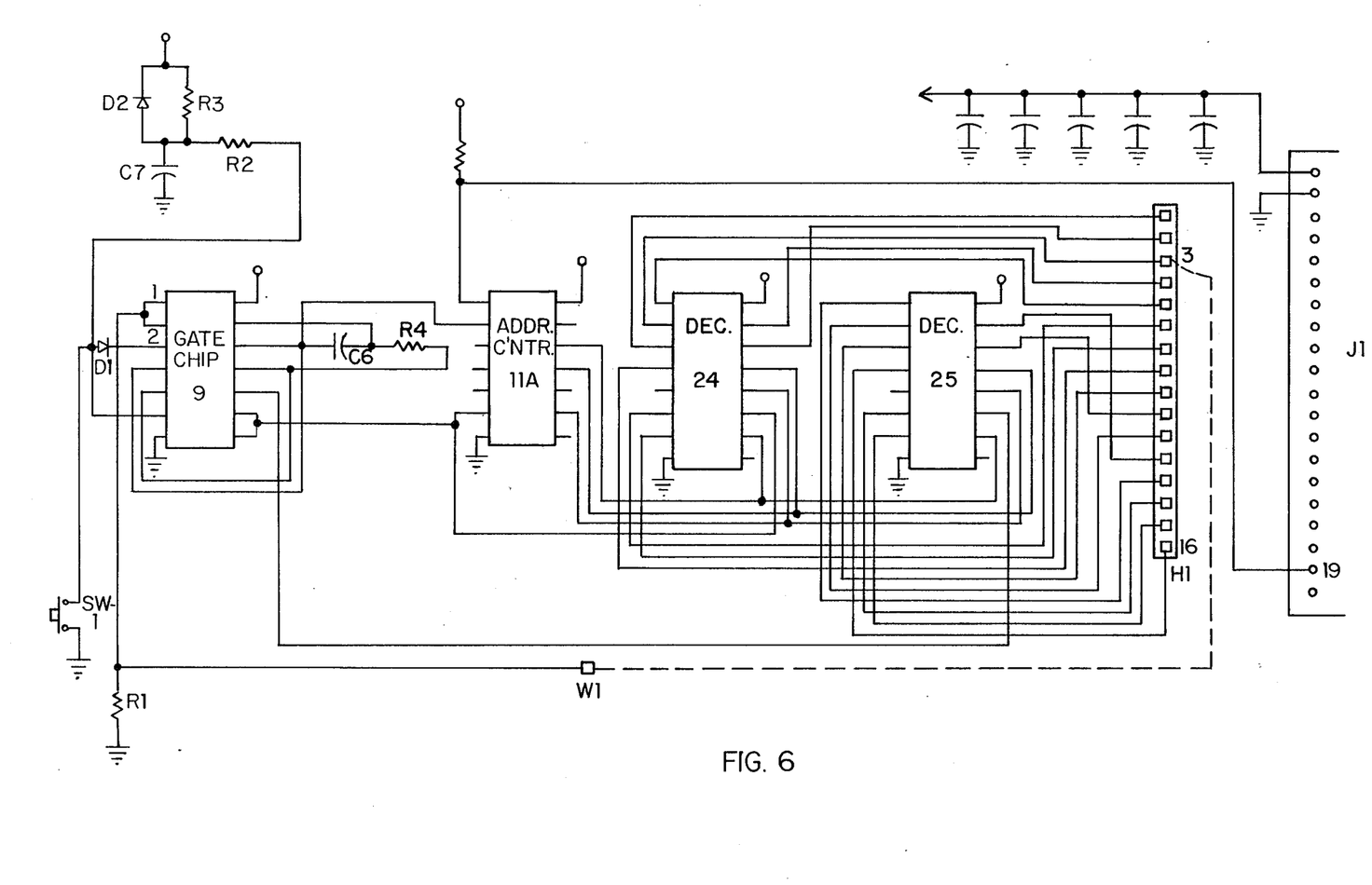
FIG. 6 is a schematic view of the selector board circuit of the present invention.

FIG. 6 shows the selector board circuit of the present invention. The selector boards 22 are generally manually switched on for single or multiple messages. Each memory board outputs a selector pulse on lead No. 19 of connecter J1. This output pulse is used to step the selector board which then enables the next memory board. The selector board operates on the same 5 volt power bus as the memory boards. The selector board is also supported by a 3 volt battery. This battery is necessary to avoid memory changes or steps during power up or power down. At 3 volts and in a static condition, the selector board draws about 10 microamps, which is about the same as the memory board.

A flying lead from H1 is connected to each memory board. Referring to FIG. 6, the next position after the last memory board 21 is connected to W1. A high signal on lead W1 causes a high signal to appear on pins 1 and 2 of gate 9 which are the inputs to a NAND gate configured as an inverter. Pin 3 of gate 9 is the output of the inverter which through diode D1 triggers a short duration one shot made up of individual NAND gates wired similar to NAND gates B and D of FIG. 5. Pin 12 of gate 9 then goes high which resets the binary address counter 11A.

The binary address counter 11A advances on high to low transitions of the select bus lead No. 19. Each pulse advances the counter one step. This binary address is decoded by decoders 24 and 25. For the four bit address counter 11A, decoders 24 and 25 give sixteen outputs. Fifteen of these outputs are used to enable memory boards. The sixteenth output is connected through W1 to reset the binary address counter 11A. The fourth NAND gate of gate chip 9 is used as the fourth binary bit inverter to activate the second decoder. When power is applied initially, a POR (power-on-reset) circuit is used to hold the enable to the first memory board. R3, C7 and D2 make up this network. Current through resistor R3 charges capacitor C7. This time constant is about two seconds. On power down, diode D2 will discharge capacitor C7 to prevent long discharge. Resistor R2 to the gate of the one shot is for isolation. Switch SW-1 is a manual reset to force enable of the first memory board. Time constant components R4 and C6 determine the one shot pulse width. These may be changed for longer or shorter pulse which may be required. Resistor R1 is used to hold the input (pins 1 and 2 of gate 9) low during changing of the jumper to W1.

Although I have described my invention by reference to a particular illustrative embodiment thereof, many changes and modifications of the invention may become apparent to those skilled in the art without departing from the spirit and scope of the invention.

What is claimed is:

1. A digital recorder comprising:
    an input digital filter means for receiving an input analog signal and for high frequency limiting said input analog signal;
    an analog to digital converter coupled to said input digital filter means for converting said high frequency limited analog input signal to a digital signal;

a memory means coupled to said analog to digital converter for storing said digital signal;

a digital to analog converter coupled to said memory means for converting said digital signal to an output analog signal;

an output digital filter means coupled to said digital to analog converter for filtering said output analog signal;

a clock source providing a first clocking frequency signal; and a frequency divider means including:

an even fequency divider having an input for receiving said first clocking frequency signal and having a plurality of outputs, each output providing a clocking frequency signal having a frequency substantially equal to the frequency of the first clocking frequency signal divided by an even integer;

a pair of diodes having respective cathodes connected to respective ones of said plurality of said plurality of outputs, and having commonly connected anodes connected to a differenct one of said plurality of outputs; and a resistor connectable between a source of voltage and said commonly connected anodes;

wherein said diodes and said resistor cause said even frequency divider to skip all individual 1's appearing on said output connected to said anodes to accomplish odd frequency division and to provide a second clocking frequency signal synchronized with said first clocking frequency signal and having a frequency substantially equal to said first clocking frequency divided by an odd integer;

said first clocking frequency signal driving said input digital filter means and said output digital filter means, and said second clocking frequency signal driving said analog to digital convertor, said memory means and said digital to analog converter.

2. The digital recorder according to claim 1, wherein said clock source includes a clock means operating at said first clocking frequency to provide said first clocking frequency signal, said clock means being located on board one of said digital filter means.

3. The digital recorder according to claim 2, wherein the ratio of a high frequency response of said digital filters to the first clocking frequency is approximately 50 to 1.

4. The digital recorder according to claim 1, wherein said memory is solid state memory.

5. The digital recorder according to claim 4, wherein said solid state memory is CMOS memory.

6. The digital recorder according to claim 5, wherein said solid state memory is an expandable memory.

* * * * *